US012772531B2

(12) United States Patent
Dejarld et al.

(10) Patent No.: US 12,772,531 B2
(45) Date of Patent: Oct. 20, 2026

(54) T-GATE TRANSISTOR WITH MINI FIELD PLATE AND ANGLED GATE STEM

(71) Applicant: Raytheon Company, Waltham, MA (US)

(72) Inventors: Matthew Thomas Dejarld, Billerica, MA (US); Eduardo M. Chumbes, Andover, MA (US); Maher Bishara Tahhan, Tewksbury, MA (US); David Patrick Hunley, Salem, NH (US)

(73) Assignee: Raytheon Company, Arlington, VA (US)

(*) Notice: Subject to any disclaimer, the term of this patent is extended or adjusted under 35 U.S.C. 154(b) by 623 days.

(21) Appl. No.: 17/822,937

(22) Filed: Aug. 29, 2022

(65) Prior Publication Data

US 2024/0072130 A1 Feb. 29, 2024

(51) Int. Cl.

| | |
|---|---|
| ***H10D 64/00*** | (2025.01) |
| ***H10D 30/01*** | (2025.01) |
| ***H10D 64/01*** | (2025.01) |
| ***H10D 64/27*** | (2025.01) |

(52) U.S. Cl.

CPC ......... *H10D 64/112* (2025.01); *H10D 30/015* (2025.01); *H10D 64/0125* (2026.01); *H10D 64/111* (2025.01); *H10D 64/411* (2025.01)

(58) Field of Classification Search

CPC ................ H10D 64/111; H10D 64/112; H10D 64/411; H10D 30/015; H01L 21/28587

See application file for complete search history.

(56) References Cited

U.S. PATENT DOCUMENTS

| | | | | |
|---|---|---|---|---|
| 6,867,078 B1 | 3/2005 | Green et al. | | |
| 8,741,715 B2 * | 6/2014 | Moore | H10D 30/015 | 438/270 |
| 8,754,496 B2 * | 6/2014 | Tserng | H10D 30/4755 | 257/E29.01 |
| 2007/0164321 A1 * | 7/2007 | Sheppard | H10D 30/015 | 257/256 |
| 2007/0164322 A1 * | 7/2007 | Smith | H10D 30/015 | 257/256 |

(Continued)

FOREIGN PATENT DOCUMENTS

| | | | |
|---|---|---|---|
| CN | 104950596 A * | 9/2015 | |
| CN | 113646870 A * | 11/2021 | H10P 50/283 |

(Continued)

OTHER PUBLICATIONS

PCT International Search Report and Written Opinion dated Oct. 30, 2023 for International Application No. PCT/US2023/067020; 20 Pages.

PCT Invitation to Pay Additional Fee's and Partial International Search Report dated Sep. 8, 2023 for International Application No. PCT/US2023/067020; 11 Pages.

(Continued)

*Primary Examiner* — Joseph C. Nicely

(57) ABSTRACT

A transistor and method of fabricating the same comprising a channel layer; an epitaxial barrier layer on the channel layer; an epitaxial cap layer on the epitaxial barrier layer; a dielectric layer on the epitaxial cap layer having an opening through to the epitaxial barrier layer; a gate having angled sidewalls in the opening of the dielectric layer; a mini field plate having angled sidewalls on the gate; and a gate top on the mini field plate, wherein the gate, the mini field plate, and the gate top form a "T" shape.

20 Claims, 11 Drawing Sheets

(56) References Cited

U.S. PATENT DOCUMENTS

| | | | | |
|---|---|---|---|---|
| 2009/0108299 | A1* | 4/2009 | Smorchkova ........ | H10D 30/015<br>257/E21.403 |
| 2009/0159930 | A1* | 6/2009 | Smorchkova ........ | H10D 30/015<br>257/E21.403 |
| 2011/0049526 | A1* | 3/2011 | Chu ..................... | H10D 30/015<br>257/E29.089 |
| 2011/0127604 | A1 | 6/2011 | Sato | |
| 2013/0313561 | A1* | 11/2013 | Suh ...................... | H10D 30/015<br>257/E21.403 |
| 2015/0311084 | A1* | 10/2015 | Moore ................. | H10D 30/015<br>438/572 |
| 2019/0157440 | A1* | 5/2019 | Green .................. | H10D 30/015 |
| 2019/0371927 | A1 | 12/2019 | Kajiwara et al. | |
| 2020/0321441 | A1* | 10/2020 | Wong ................... | H10D 30/015 |
| 2022/0376105 | A1* | 11/2022 | Guo ..................... | H10D 30/015 |

FOREIGN PATENT DOCUMENTS

| | | | | |
|---|---|---|---|---|
| JP | 200586171 | A | 3/2005 | |
| JP | 2009524242 | A | 6/2009 | |
| JP | 2015072940 | A | 4/2015 | |
| JP | 2019207942 | A | 12/2019 | |
| JP | 2019220557 | A | 12/2019 | |
| WO | WO-2012017389 | A1 * | 2/2012 | .............. H10P 14/42 |

OTHER PUBLICATIONS

Office Action issued Aug. 20, 2025 in connection with Korean Patent Application No. 10-2025-7003758, 14 pages.

Office Action dated Feb. 16, 2026 in connection with Japanese Patent Application No. 2025-511460, 19 pages.

* cited by examiner

PRIOR ART

PRIOR ART

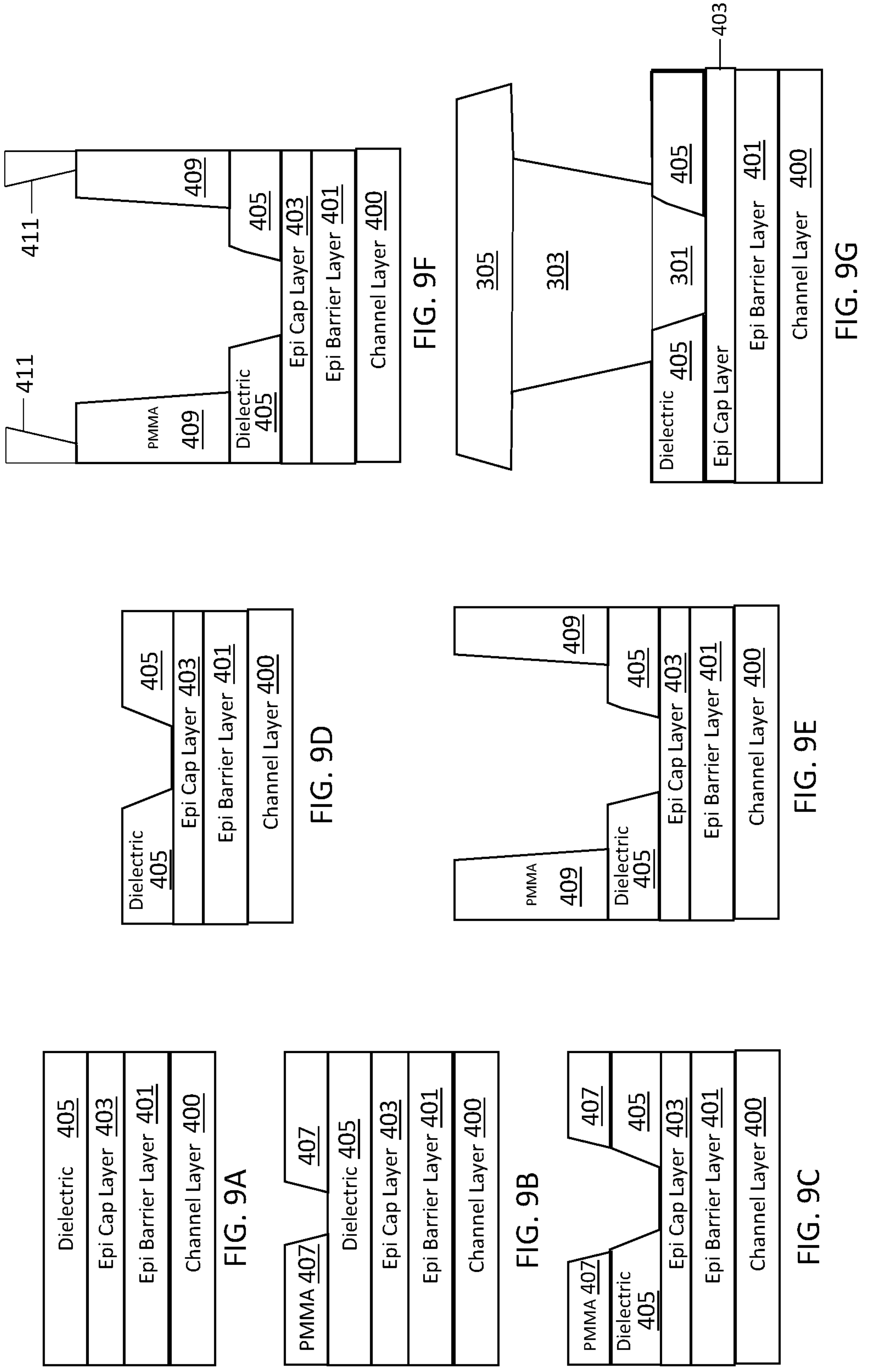
Dielectric 405
Epi Cap Layer 403
Epi Barrier Layer 401
Channel Layer 400
FIG. 9A
PMMA 407
407
Dielectric 405
Epi Cap Layer 403
Epi Barrier Layer 401
Channel Layer 400
FIG. 9B
PMMA 407
407
Dielectric 405
405
Epi Cap Layer 403
Epi Barrier Layer 401
Channel Layer 400
FIG. 9C
Dielectric 405
405
Epi Cap Layer 403
Epi Barrier Layer 401
Channel Layer 400
FIG. 9D
PMMA 409
409
Dielectric 405
405
Epi Cap Layer 403
Epi Barrier Layer 401
Channel Layer 400
FIG. 9E
411
411
PMMA 409
409
Dielectric 405
405
Epi Cap Layer 403
Epi Barrier Layer 401
Channel Layer 400
FIG. 9F
305
303
301
403
Dielectric 405
405
Epi Cap Layer
Epi Barrier Layer 401
Channel Layer 400
FIG. 9G

T-GATE TRANSISTOR WITH MINI FIELD PLATE AND ANGLED GATE STEM

BACKGROUND

One of the most common gate structures for semiconductor transistors is a T-gate 100 as shown in FIG. 1. The T-gate 100 structure consists of a gate stem 101 (e.g., a few nanometers to a few hundred nanometers) that contacts an epitaxial layer on a semiconductor substrate, and a wider top (e.g., a gate top 103 in the form of the letter "T") further from the epitaxial layer. The gate stem improves a frequency response of the transistor and the wider gate top 103 lowers a gate resistance of the transistor.

An issue with a transistor having a T-gate is that the transistor may struggle to perform under high power and high electric field conditions. This may also lead to increased current collapse effects in Gallium Nitride (GaN) high electron mobility transistor (HEMT) devices.

Another commonly used gate structure for a transistor is a gamma gate 200 as shown in FIG. 2. The gamma gate 200 also consists of a gate stem 201 and a gate top 203, but the gate stem 201 in a gamma-gate transistor is typically embedded in a dielectric or a cap layer, and the gate top 203 sits much closer to a substrate of the transistor. Sidewalls of the gate stem 201, and the overhang of the gate top 203 act as field plates 205 that temper an electric field near the gate stem 201.

An issue with a transistor having a gamma gate is that a gate top closer to a substrate increases an effective gate length due to capacitive loading. Thus, a transistor with a gamma gate may struggle to be efficient at high frequencies.

SUMMARY

In accordance with the concepts described herein, an exemplary transistor with a mini field plate and an angled gate stem (e.g., a mini field plate gate transistor) and method are provided.

In accordance with the concepts described herein, an exemplary transistor with a mini field plate and an angled gate stem and method provides a transistor with a gate structure having three sections, a gate stem, a mini field plate, and a gate top.

DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which:

FIGS. 9A, 9B, 9C, 9D, 9E, and 9F are illustrations of exemplary process steps for forming the transistor of FIG. 4;

DETAILED DESCRIPTION

The present disclosure provides exemplary methods and apparatuses for a transistor with at least one mini field plate and an angled gate stem (e.g., a mini field plate gate transistor). The present disclosure applies to HEMT devices and all lateral-based field effect transistors (FETs) or transistors.

Figure 1:
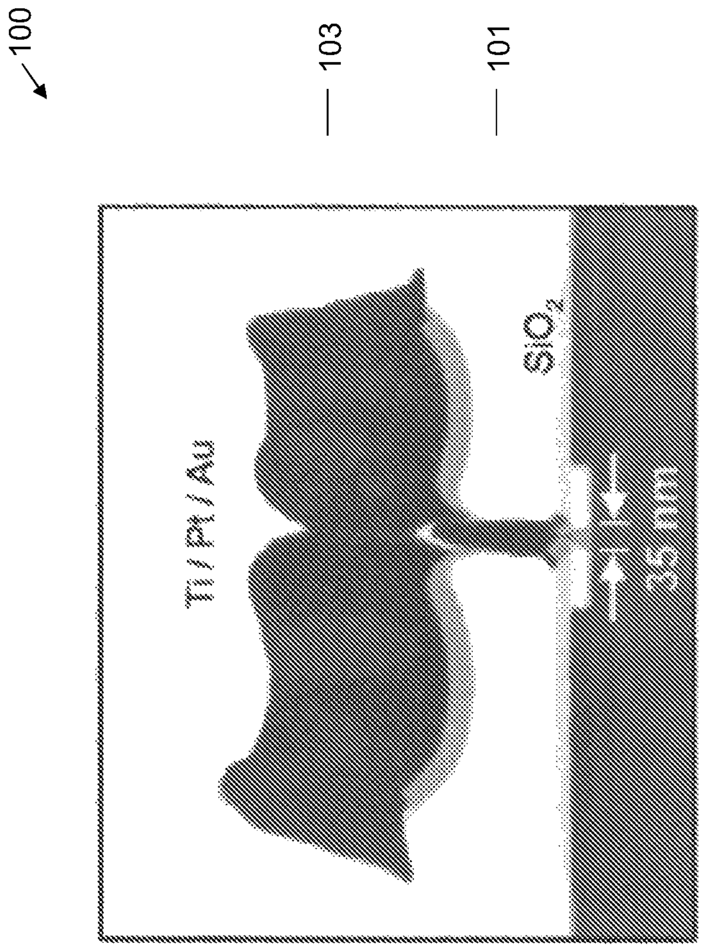
FIG. 1 is a photograph of a cross-section of a prior art transistor with a T-gate.
Figure 2:
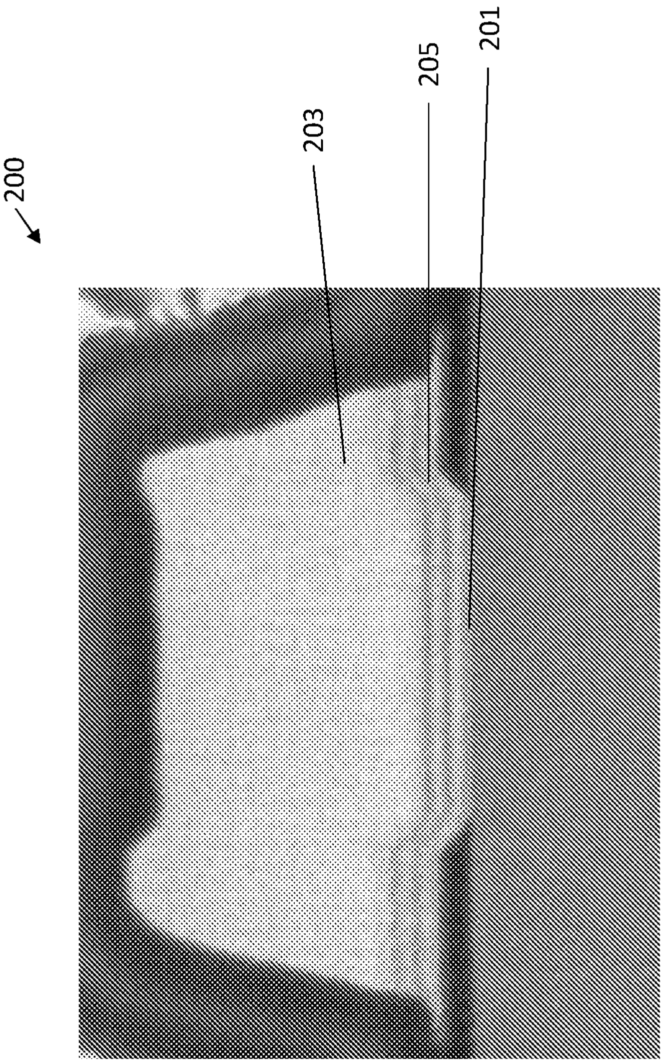
FIG. 2 is a photograph of a cross-section of a prior art transistor with a gamma gate.
Figure 3:
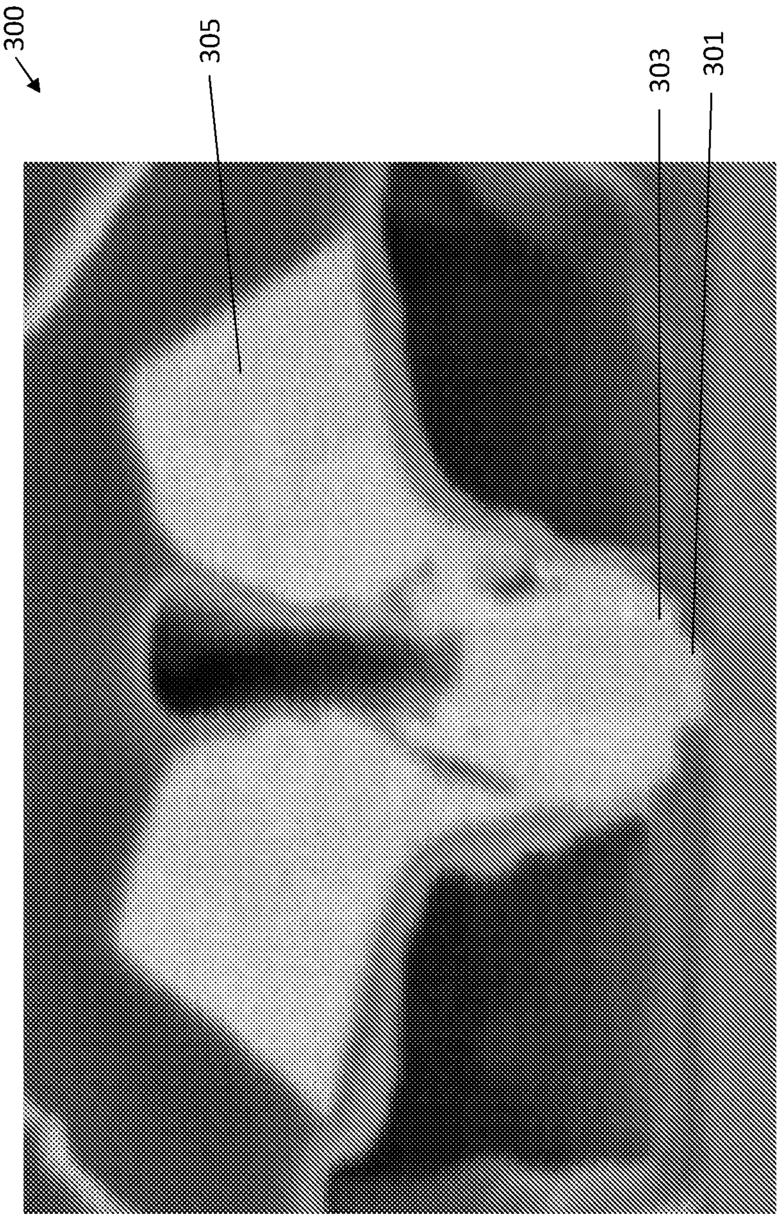
FIG. 3 is a photograph of an exemplary embodiment of a transistor with a T-gate having an angled gate stem.

FIG. 3 is a photograph of an exemplary embodiment of a transistor 300 with a T-gate having an angled gate stem 301. The transistor 300 includes a gate structure having three sections, a gate stem 301, a mini field-plate 303 (e.g., mini-FP), and a gate top 305.

Figure 4:
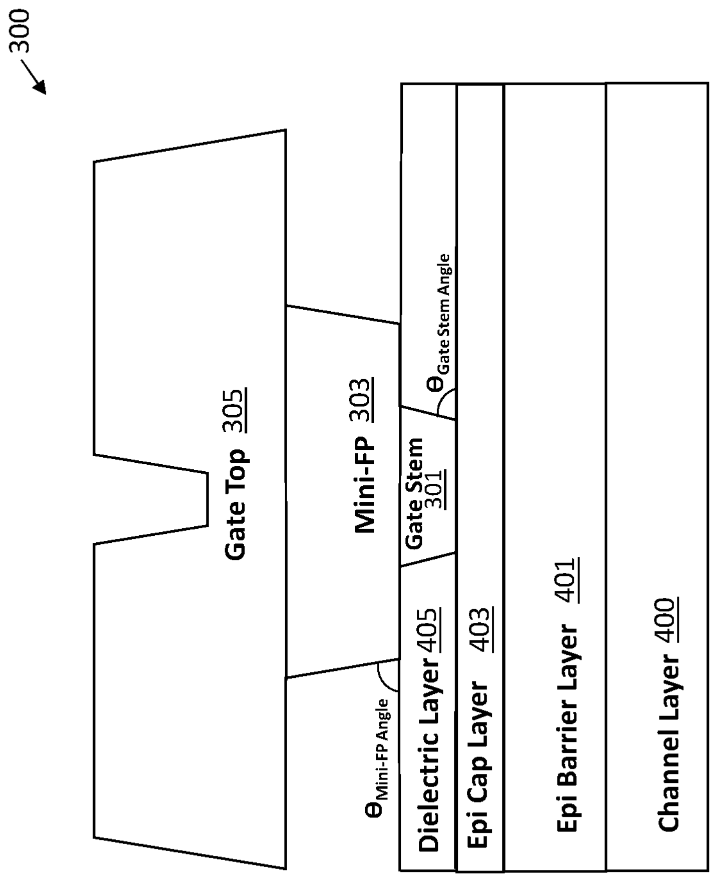
FIG. 4 is an illustration of an exemplary embodiment of a cross-section of a transistor with a T-gate having an angled gate stem that contacts an epitaxial cap layer and a mini field plate.

FIG. 4 is an illustration of an exemplary embodiment of a cross-section of a transistor 300 with a T-gate having an angled gate stem 301 that contacts an epitaxial (epi) cap layer 403 (e.g., an epitaxial layer that sits on top of, or "caps", another epitaxial layer). The transistor 300 comprises a channel layer 400, an epitaxial barrier layer 401 on the channel layer 400, the epitaxial cap layer 403 on the epitaxial barrier layer 401, a dielectric layer 405 on the epitaxial cap layer 403, a gate stem 301 on the epitaxial cap layer 403, a mini field plate 303 on the gate stem 301, and a gate top 305 on the mini field plate 303. In an exemplary embodiment, the gate stem 301, the mini field plate 303, and the gate top 305 comprise Nickel (Ni), Platinum (Pt), and Gold (Au) metals, respectively. However, the present disclosure is not limited thereto. In an exemplary embodiment, a substrate comprises a channel layer 400.

The epitaxial cap layer 403 may be latticed matched to the epitaxial barrier layer 401 or not lattice matched to the epitaxial barrier layer 401. The epitaxial cap layer 403 may comprise any semiconductor Group III nitride.

The gate stem 301 contacts the epitaxial cap layer 403. In an exemplary embodiment where the substrate comprises a channel layer 400, the substrate comprises Gallium Nitride (GaN). However, the present disclosure is not limited thereto. In an exemplary embodiment where the substrate comprises a channel layer 400, the substrate may also comprise Gallium Arsenide (GaAs), sapphire, Indium Phosphide (InP), silicon (Si), silicon carbide (SiC), aluminum nitride (AlN), or Indium Antimonide (InSb).

The gate stem 301 may range in size (e.g., gate length) from a few nanometers (e.g., ~20-30 nm) up to a few hundred nanometers (e.g., 300-500+ nm). Angled sidewalls of the gate stem 301 may be formed by etching through the dielectric layer 405. In an exemplary embodiment, the dielectric layer 405 comprises silicon nitride (SiN) and the epitaxial cap layer 401 comprises Aluminum Gallium Nitride (AlGaN). However, the present disclosure is not limited thereto. The gate stem 301 may have an exterior angle at the base of the gate stem 301 of 45-89 degrees. The closer metal is to the substrate 400, the higher a capacitance and the higher an electrical field between the metal and the substrate 400. Controlling the angle of the gate stem 301 controls the impact of the electrical field. Reducing the angle of the gate stem 301 reduces the impact of the electrical field. Increasing the angle of the gate stem 301 increases the impact of the electrical field. The gate stem 301 may be formed using a lithographic step and an etch step.

The mini-FP 303 may be on top of the dielectric layer 405, which may be on the epitaxial cap layer 401. The mini-FP 303 may be wider than the length of the gate stem 301. In an exemplary embodiment, the mini-FP 303 may be 1.5 to 4 times wider than the length of the gate stem 301. However, the present disclosure is not limited thereto. The wider the mini-FP 303, the lower a lateral electrical field on the gate stem 301. The narrower the mini-FP 303, the higher the lateral electrical field on the gate stem 301. The width of the min-FP 303 does not affect a vertical electrical field on the gate step 301.

The angled sidewalls of the mini-FP 303 may be formed at an angle with respect to a base of the mini-FP 303. In an exemplary embodiment, the exterior angle of the mini-FP 303 may be from 45 degrees to 89 degrees. The closer metal is to the channel layer 400, the higher a capacitance and the higher an electrical field between the metal and the channel layer 400. Controlling the angle of the mini-FP 303 controls the impact of an electrical field. Reducing the angle of the mini-FP 303 increases the impact of the electrical field. Increasing the angle of the mini-FP 303 decreases the impact of the electrical field. If the exterior angle of the mini-FP 303 is too big, then the gate top 305 might become unstable and collapse. The mini-FP 303 may be formed at the same time as the gate top 305 and may self-align to the gate top 305. A center of the mini-FP 303 may be aligned with a center of the gate stem 301 or may be offset to either side of the center of the gate stem 301.

The gate top 305 may be the largest feature of the gate of the transistor 300 by cross sectional area and may connect to the mini-FP 303. The gate top 305 might not directly contact the dielectric layer 405, the epitaxial cap layer 401, or the epitaxial barrier layer 401. The gate top 305 may be wider than the mini-FP 303 and may comprise two wings that branch out on each side of the mini-FP 303. The dimensions of the gate top 305 may be greater than or equal to the dimensions of the mini-FP 303. In an exemplary embodiment, the gate top 305 may be approximately 400-1000 nm wide. If the gate top 305 is too wide, or too thick, the gate top 305 may become unstable and break off from the mini-FP 303 and the gate stem 301.

The transistor 300 with an angled gate stem 301, mini-FP 303, and gate top 305 combines the advantages of both a prior art T-gate transistor and a gamma-gate transistors. The gate structure of the transistor 300 is controlled via the angle of the gate stem 301, the width of the mini-FP 303, and the contact angle of the mini-FP 303 and the dielectric layer 405. The angle of the gate stem 301 traverses the dielectric layer 405 and is customizable through etch processing. The width of the mini-FP 303 is customizable through lithography methods. The contact angle of the mini-FP 303 and the dielectric layer 405 are customizable via photoresist and lithography methods. The transistor 300 may operate at higher frequencies and higher voltages than prior art T-gate transistors.

Figure 5:
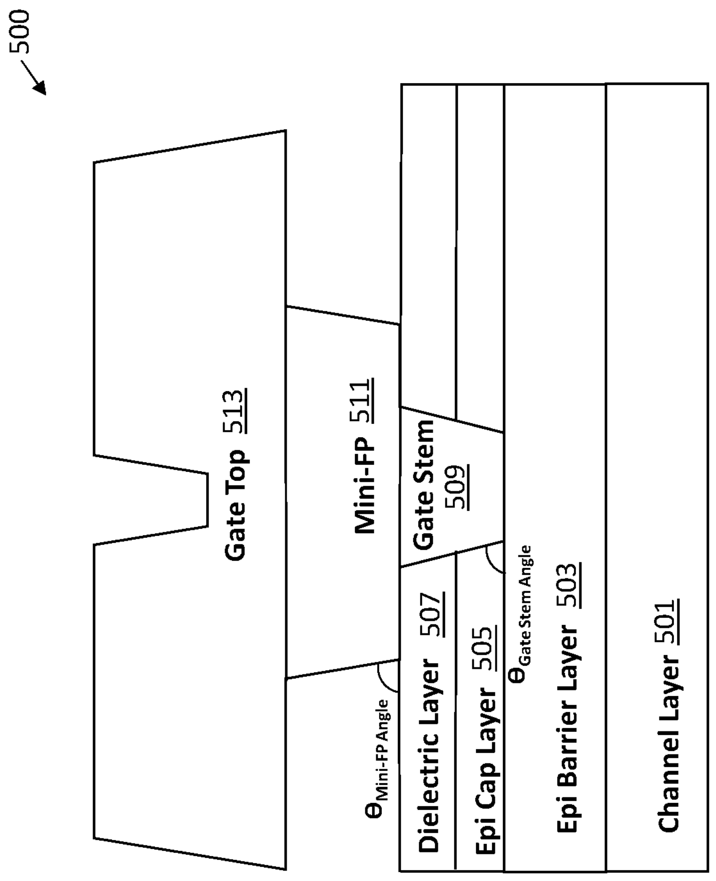
FIG. 5 is an illustration of an exemplary embodiment of a cross-section of a transistor with a T-gate having an angled gate stem that contacts an epitaxial barrier layer through an epitaxial cap layer and a mini field plate.

FIG. 5 is an illustration of an exemplary embodiment of a cross-section of a transistor 500 with a T-gate having an angled gate stem 509 that contacts an epitaxial barrier layer 503. The transistor 500 comprises a channel layer 501, the epitaxial barrier layer 503 on the channel layer 501, the epitaxial cap layer 505 on the epitaxial barrier layer 503, a dielectric layer 507 on the epitaxial cap layer 505, the gate stem 509 on the epitaxial barrier layer 503, a mini field plate 511 on the gate stem 509, and a gate top 513 on the mini field plate 511. In an exemplary embodiment, the gate stem 509, the mini field plate 511, and the gate top 513 comprise Ni, Pt, and Au metals, respectively. However, the present disclosure is not limited thereto. In an exemplary embodiment, a substrate comprises a channel layer 501.

The gate stem 509 contacts the epitaxial barrier layer 503. In an exemplary embodiment where the substrate comprises a channel layer 501, the substrate comprises GaN. However, the present disclosure is not limited thereto. The substrate may also comprise GaAs, sapphire, InP, Si, SiC, AlN, or InSb.

The gate stem 509 may range in size (e.g., gate length) from a few nanometers (e.g., ~20-30 nm) up to a few hundred nanometers (e.g., 300-500+ nm). Angled sidewalls of the gate stem 509 may be formed by etching through the dielectric layer 507 and the epi cap layer 505. In an exemplary embodiment, the dielectric layer 507 comprises SiN and the epitaxial cap layer 505 comprises AlGaN. However, the present disclosure is not limited thereto. The gate stem 509 may have an exterior angle at the base of the gate stem 509 of 45-89 degrees. The gate stem 509 may be formed using a lithographic step and an etch step.

The mini-FP 511 may be on top of the dielectric layer 507, which may be on the epitaxial cap layer 505. The mini-FP 511 may be wider than the length of the gate stem 509. In an exemplary embodiment, the mini-FP 511 may be 1.5 to 4 times wider than the length of the gate stem 509. However, the present disclosure is not limited thereto.

The angled sidewalls of the mini-FP 511 may be formed at an angle with respect to a base of the mini-FP 511. In an exemplary embodiment, the exterior angle of the mini-FP 511 may be from 45 degrees to 89 degrees. If the exterior angle of the mini-FP 511 is too big, then the gate top 513 might become unstable and collapse. The mini-FP 511 may be formed at the same time as the gate top 513 and may self-align to the gate top 513. A center of the mini-FP 511 may be aligned with a center of the gate stem 509 or may be offset to either side of the center of the gate stem 509.

The gate top 513 may be the largest feature of the gate of the transistor 500 by cross sectional area and may connect to the mini-FP 511. The gate top 513 might not directly contact the dielectric layer 507, the epitaxial cap layer 505, or the epitaxial barrier layer 503. The gate top 513 may be wider than the mini-FP 511 and may comprise two wings that branch out on each side of the mini-FP 511. The dimensions of the gate top 513 may be greater than or equal to the dimensions of the mini-FP 511. In an exemplary embodiment, the gate top 513 may be approximately 400-1000 nm wide. If the gate top 513 is too wide, or too thick, the gate top 513 may become unstable and break off from the mini-FP 511 and the gate stem 509.

The transistor 500 with an angled gate stem 509, mini-FP 511, and gate top 513 combines the advantages of both a prior art T-gate transistor and a gamma-gate transistors. The gate structure of the transistor 500 is controlled via the angle of the gate stem 509, the width of the mini-FP 511, and the contact angle of the mini-FP 511 and the dielectric layer 507. The angle of the gate stem 509 traverses the dielectric layer 507 and the epi cap layer 505 and is customizable through etch processing. The width of the mini-FP 511 is customizable through lithography methods. The contact angle of the mini-FP 511 and the dielectric layer 507 are customizable via photoresist and lithography methods. The transistor 500 may operate at higher frequencies and higher voltages than prior art T-gate transistors.

Figure 6:
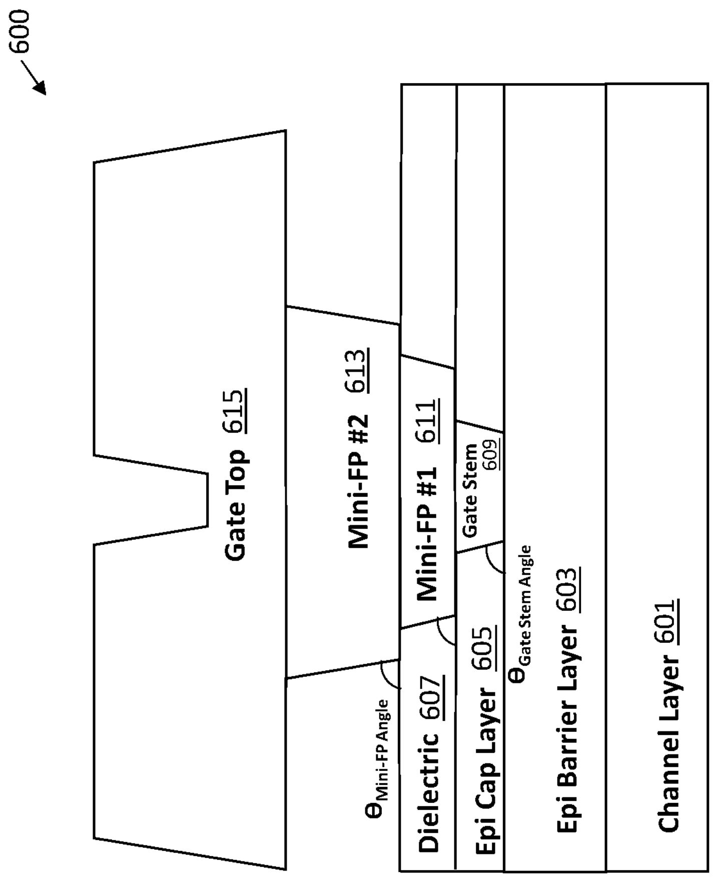
FIG. 6 is an illustration of an exemplary embodiment of a cross-section of a transistor with a T-gate having an angled gate stem that contacts an epitaxial barrier layer and has two mini field plates.

FIG. 6 is an illustration of an exemplary embodiment of a cross-section of a transistor 600 with a T-gate having an angled gate stem 609 that contacts an epitaxial barrier layer 603 and has a first mini field plate 611 and a second mini field plate 613. The transistor 600 comprises a channel layer 601, the epitaxial barrier layer 603 on the channel layer 601, an epitaxial cap layer 605 on the epitaxial barrier layer 603, a dielectric layer 607 on the epitaxial cap layer 605, the gate stem 609 on the epitaxial barrier layer 603, the first mini field plate 611 on the gate stem 609, the second mini field plate 613 on the first mini field plate 611, and a gate top 615 on the second mini field plate 613. In an exemplary embodiment, the gate stem 609, the first mini field plate 611, the second mini field plate 613, and the gate top 615 comprise Ni, Pt, and Au metals, respectively. However, the present disclosure is not limited thereto. In an exemplary embodiment, a substrate comprises the channel layer 601.

The gate stem 609 contacts the epitaxial barrier layer 603. In an exemplary embodiment where a substrate comprises the channel layer 601, the substrate may be GaN. However, the present disclosure is not limited thereto. The substrate may also comprise GaAs, sapphire, InP, Si, SiC, AlN or InSb.

The gate stem 609 may range in size (e.g., gate length) from a few nanometers (e.g., ~20-30 nm) up to a few hundred nanometers (e.g., 300-500+ nm). Angled sidewalls of the gate stem 609 may be formed by etching through the epi cap layer 605. In an exemplary embodiment, the epitaxial cap layer 605 comprises AlGaN. However, the present disclosure is not limited thereto. The gate stem 609 may have an exterior angle at the base of the gate stem 609 of 45-89 degrees. The gate stem 609 may be formed using a lithographic step and an etch step.

Angled sidewalls of the first mini field plate 611 may be formed by etching through the dielectric layer 607. In an exemplary embodiment, the dielectric layer 607 comprises SiN. However, the present disclosure is not limited thereto. The first mini field plate 611 may have an exterior angle at the base of the first mini field plate 611 of 45-89 degrees. The first mini-FP 611 may be on top of the epi cap layer 605. The first mini-FP 611 may be wider than the length of the gate stem 609. In an exemplary embodiment, the first mini-FP 611 may be 1.5 to 4 times wider than the length of the gate stem 609. However, the present disclosure is not limited thereto. Advantages provided by having the first mini-FP 611 and the second mini-FP 613 include lower leakage current, reduced dispersion, enhanced breakdown voltage, higher current density, and greater control in tuning/graduating performance by setting a certain width difference between the first mini-FP 611 and the second mini-FP 613.

If the exterior angle of the first mini-FP 611 is too small, then the second mini field plate 613 and the gate top 615 might become unstable and collapse. The first mini-FP 611 may be formed at the same time as the second mini-FP 613 and the gate top 615 and may self-align to the second mini-FP 613 and the gate top 615. A center of the first mini-FP 611 may be aligned with a center of the gate stem 609 or may be offset to either side of the center of the gate stem 609.

Angled sidewalls of the second mini field plate 613 may be formed by etching through photoresist deposited on the dielectric layer 607. In an exemplary embodiment, the photoresist may be polymethyl methacrylate (PMMA), zeon electron beam positive-tone resist (ZEP), polydimethylglutarimide (PMGI), methyl methacrylate (MMA), or other electron beam lithography compatible resist. In an exemplary embodiment, the dielectric layer 607 comprises SiN. However, the present disclosure is not limited thereto. The second mini field plate 613 may have an exterior angle at the base of the second mini field plate 613 of 45-89 degrees. The second mini-FP 613 may be on top of the dielectric layer 607. The second mini-FP 613 may be wider than the length of the gate stem 609 and wider than the width of the first mini-FP 611. In an exemplary embodiment, the second mini-FP 613 may be 1.5 to 4 times wider than the length of the gate stem 609 and may be larger than the first mini-FP. However, the present disclosure is not limited thereto.

If the exterior angle of the second mini-FP 613 is too big, then the gate top 615 might become unstable and collapse. The second mini-FP 613 may be formed at the same time as the gate top 615 and may self-align to the gate top 615. A center of the second mini-FP 613 may be aligned with a center of the gate stem 609 or may be offset to either side of the center of the gate stem 609.

The gate top 615 may be the largest feature of the gate of the transistor 600 by cross sectional area and may connect to the second mini-FP 613. The gate top 615 might not directly contact the dielectric layer 607, the epitaxial cap layer 605, or the epitaxial barrier layer 603. The gate top 615 may be wider than the second mini-FP 613 and may comprise two wings that branch out on each side of the second mini-FP 613. The dimensions of the gate top 615 may be greater than or equal to the dimensions of the second mini-FP 613. In an exemplary embodiment, the gate top 615 may be approximately 400-1000 nm wide. If the gate top 615 is too wide, or too thick, the gate top 615 may become unstable and break off from the second mini-FP 613 and the gate stem 609.

The transistor 600 with an angled gate stem 609, first mini-FP 611, second mini-FP 613, and gate top 615 combines the advantages of both a prior art T-gate transistor and a gamma-gate transistors. The gate structure of the transistor 600 is controlled via the angle of the gate stem 609, the width of the first mini-FP 611, the width of the second mini-FP 613, the contact angle of the first mini-FP 611, the contact angle of the second mini-FP 613, and the dielectric layer 607. The angle of the gate stem 609 traverses the epi cap layer 605 and is customizable through etch processing. The width of the first mini-FP 611 and the second mini-FP 613 are customizable through lithography methods. The contact angles of the first mini-FP 611, the second mini-FP 613, and the dielectric layer 607 are customizable via photoresist and lithography methods. The transistor 600 may operate at higher frequencies and higher voltages than prior art T-gate transistors.

Figure 7:
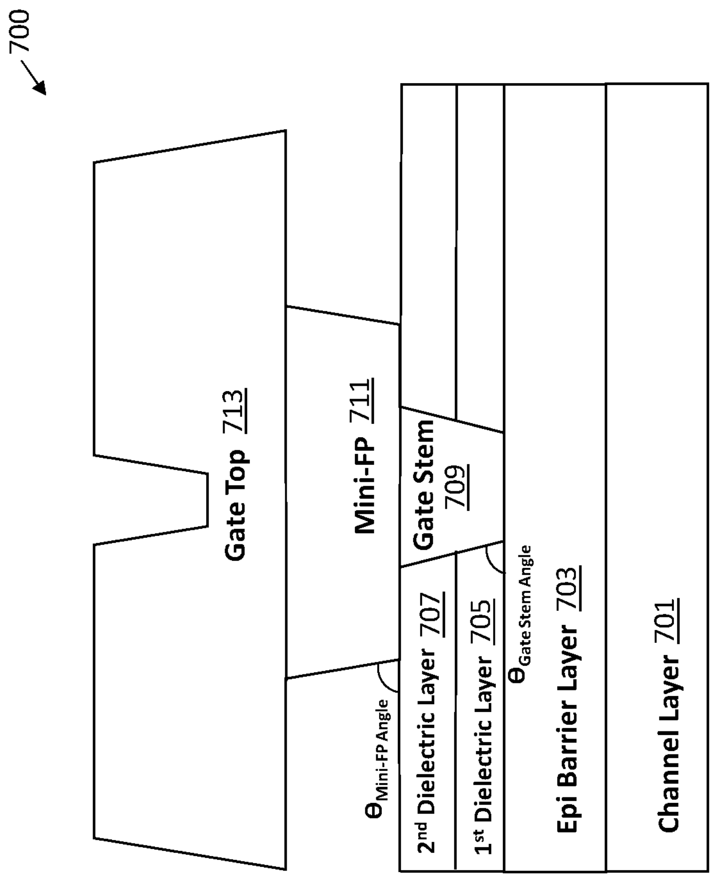
FIG. 7 is an illustration of an exemplary embodiment of a cross-section of a transistor with a T-gate having an angled gate stem that contacts an epitaxial barrier layer through two dielectric layers and a mini field plate.

FIG. 7 is an illustration of an exemplary embodiment of a cross-section of a transistor 700 with a T-gate having an angled gate stem 709 that contacts an epitaxial barrier layer 703. The transistor 700 comprises a channel layer 701, the epitaxial barrier layer 703 on the channel layer 701, a first dielectric layer 705 on the epitaxial barrier layer 703, a second dielectric layer 707 on the first dielectric layer 705, the gate stem 709 on the epitaxial barrier layer 703, a mini field plate 711 on the gate stem 709, and a gate top 713 on the mini field plate 711. In an exemplary embodiment, the gate stem 709, the mini field plate 711, and the gate top 713 comprise Ni, Pt, and Au metals, respectively. However, the present disclosure is not limited thereto. In an exemplary embodiment, a substrate comprises the channel layer 701.

The gate stem 709 contacts the epitaxial barrier layer 703. In an exemplary embodiment where a substrate comprises the channel layer 701, the substrate comprises GaN. However, the present disclosure is not limited thereto. The substrate may also comprise GaAs, sapphire, InP, Si, SiC, AlN, or InSb.

The gate stem 709 may range in size (e.g., gate length) from a few nanometers (e.g., ~20-30 nm) up to a few hundred nanometers (e.g., 300-500+ nm). Angled sidewalls of the gate stem 709 may be formed by etching through the second dielectric layer 707 and the first dielectric layer 705. In exemplary embodiments, the first dielectric layer 705 and the second dielectric layer 707 may be the same or different. In exemplary embodiment, the first dielectric layer 705 and the second dielectric layer 707 each comprise an oxide, a nitride, silicon nitride, aluminum silicon nitride, or silicon dioxide. However, the present disclosure is not limited thereto. The gate stem 709 may have an exterior angle at the base of the gate stem 709 of 45-89 degrees. The gate stem 709 may be formed using a lithographic step and an etch step.

The mini-FP 711 may be on top of the second dielectric layer 707, which may be on the first dielectric layer 705. The mini-FP 711 may be wider than the length of the gate stem 709. In an exemplary embodiment, the mini-FP 711 may be 1.5 to 4 times wider than the length of the gate stem 709. However, the present disclosure is not limited thereto.

The angled sidewalls of the mini-FP 711 may be formed at an angle with respect to a base of the mini-FP 711. In an exemplary embodiment, the exterior angle of the mini-FP 711 may be from 45 degrees to 89 degrees. If the exterior angle of the mini-FP 711 is too big, then the gate top 713 might become unstable and collapse. The mini-FP 711 may be formed at the same time as the gate top 713 and may self-align to the gate top 713. A center of the mini-FP 711 may be aligned with a center of the gate stem 709 or may be offset to either side of the center of the gate stem 709.

The gate top 713 may be the largest feature of the gate of the transistor 700 by cross sectional area and may connect to the mini-FP 711. The gate top 713 might not directly contact the second dielectric layer 707, the first dielectric layer 705, or the epitaxial layer 703. The gate top 713 may be wider than the mini-FP 711 and may comprise two wings that branch out on each side of the mini-FP 711. The dimensions of the gate top 713 may be greater than or equal to the dimensions of the mini-FP 711. In an exemplary embodiment, the gate top 713 may be approximately 400-1000 nm wide. If the gate top 713 is too wide, or too thick, the gate top 713 may become unstable and break off from the mini-FP 711 and the gate stem 709.

The transistor 700 with an angled gate stem 709, mini-FP 711, and gate top 713 combines the advantages of both a prior art T-gate transistor and a gamma-gate transistors. The gate structure of the transistor 700 is controlled via the angle of the gate stem 709, the width of the mini-FP 711, and the contact angle of the mini-FP 711 and the second dielectric layer 707. The angle of the gate stem 709 traverses the second dielectric layer 707 and the first dielectric layer 705 and is customizable through etch processing. The width of the mini-FP 711 is customizable through lithography methods. The contact angle of the mini-FP 711 and the second dielectric layer 707 are customizable via photoresist and lithography methods. The transistor 700 may operate at higher frequencies and higher voltages than prior art T-gate transistors.

Figure 8:
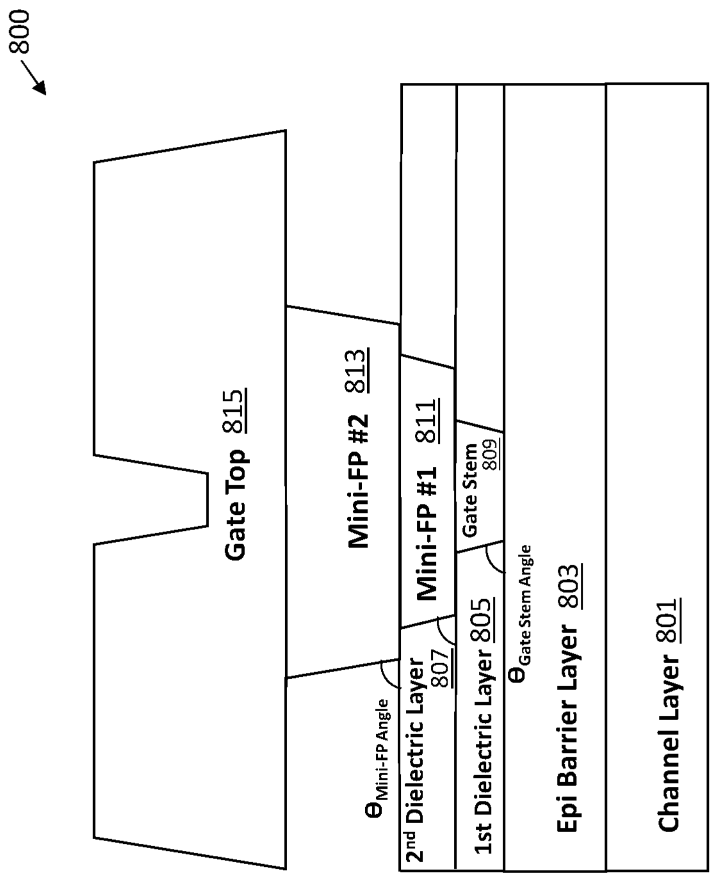
FIG. 8 is an illustration of an exemplary embodiment of a cross-section of a transistor with a T-gate having an angled gate stem that contacts an epitaxial barrier layer through two dielectric layers and has two mini field plates.

FIG. 8 is an illustration of an exemplary embodiment of a cross-section of a transistor 800 with a T-gate having an angled gate stem 809 that contacts an epitaxial barrier layer 803 and has a first mini field plate 811 and a second mini field plate 813. The transistor 800 comprises a channel layer 801, the epitaxial barrier layer 803 on the channel layer 801, a first dielectric layer 805 on the epitaxial barrier layer 803, a second dielectric layer 807 on the first dielectric layer 805, the gate stem 809 on the epitaxial barrier layer 803, the first mini field plate 811 on the gate stem 809, the second mini field plate 813 on the first mini field plate 811, and a gate top 815 on the second mini field plate 813. In an exemplary embodiment, the gate stem 809, the first mini field plate 811, the second mini field plate 813, and the gate top 815 comprise Ni, Pt, and Au metals, respectively. However, the present disclosure is not limited thereto. In an exemplary embodiment, a substrate comprises the channel layer 801.

The gate stem 809 contacts the epitaxial barrier layer 803. In an exemplary embodiment where a substrate comprises the channel layer 801, the substrate comprises GaN. However, the present disclosure is not limited thereto. The substrate may also comprise GaAs, sapphire, InP, Si, SiC, AlN, or InSb.

The gate stem 809 may range in size (e.g., gate length) from a few nanometers (e.g., ~20-30 nm) up to a few hundred nanometers (e.g., 300-500+ nm). Angled sidewalls of the gate stem 809 may be formed by etching through the first dielectric layer 805. In an exemplary embodiment, the first dielectric layer 805 comprises SiN. However, the present disclosure is not limited thereto. The gate stem 809 may have an exterior angle at the base of the gate stem 809 of 45-89 degrees. The gate stem 809 may be formed using a lithographic step and an etch step.

Angled sidewalls of the first mini field plate 811 may be formed by etching through the second dielectric layer 807. In an exemplary embodiment, the second dielectric layer 807 comprises SiN. However, the present disclosure is not limited thereto. The first mini field plate 811 may have an exterior angle at the base of the first mini field plate 811 of 45-89 degrees. The first mini-FP 811 may be on top of the first dielectric layer 805. The first mini-FP 811 may be wider than the length of the gate stem 809. In an exemplary embodiment, the first mini-FP 811 may be 1.5 to 4 times wider than the length of the gate stem 809. However, the present disclosure is not limited thereto.

If the exterior angle of the first mini-FP 811 is too big, then the second mini field plate 813 and the gate top 815 might become unstable and collapse. The first mini-FP 811 may be formed at the same time as the second mini-FP 813 and the gate top 815 and may self-align to the second mini-FP 813 and the gate top 815. A center of the first mini-FP 811 may be aligned with a center of the gate stem 809 or may be offset to either side of the center of the gate stem 809.

Angled sidewalls of the second mini field plate 813 may be formed by etching through photoresist deposited on the second dielectric layer 807. In an exemplary embodiment, the photoresist may be PMMA, ZEP, PMGI, or MMA. In an exemplary embodiment, the second dielectric layer 807 comprises SiN. However, the present disclosure is not limited thereto. The second mini field plate 813 may have an exterior angle at the base of the second mini field plate 813 of 45-89 degrees. The second mini-FP 813 may be on top of the second dielectric layer 807. The second mini-FP 813 may be wider than the length of the gate stem 809 and wider than the width of the first mini-FP 811. In an exemplary embodiment, the second mini-FP 813 may be 1.5 to 4 times wider than the length of the gate stem 809. However, the present disclosure is not limited thereto.

If the exterior angle of the second mini-FP 813 is too big, then the gate top 815 might become unstable and collapse. The second mini-FP 813 may be formed at the same time as the gate top 815 and may self-align to the gate top 815. A center of the second mini-FP 813 may be aligned with a center of the gate stem 809 or may be offset to either side of the center of the gate stem 809.

The gate top 815 may be the largest feature of the gate of the transistor 800 by cross sectional area and may connect to the second mini-FP 813. The gate top 815 might not directly contact the second dielectric layer 807, the first dielectric layer 805, or the epitaxial layer 803. The gate top 815 may be wider than the second mini-FP 813 and may comprise two wings that branch out on each side of the second mini-FP 813. The dimensions of the gate top 815 may be greater than or equal to the dimensions of the second mini-FP 813. In an exemplary embodiment, the gate top 815 may be approximately 400-1000 nm wide. If the gate top 815 is too wide, or too thick, the gate top 815 may become unstable and break off from the second mini-FP 813 and the gate stem 809.

The transistor 800 with an angled gate stem 809, first mini-FP 811, second mini-FP 813, and gate top 815 combines the advantages of both a prior art T-gate transistor and a gamma-gate transistors. The gate structure of the transistor 800 is controlled via the angle of the gate stem 809, the width of the first mini-FP 811, the width of the second mini-FP 813, the contact angle of the first mini-FP 811, the contact angle of the second mini-FP 813, and the second dielectric layer 807. The angle of the gate stem 809 traverses the first dielectric layer 805 and is customizable through etch processing. The width of the first mini-FP 811 and the second mini-FP 813 are customizable through lithography methods. The contact angles of the first mini-FP 811, the second mini-FP 813, and the second dielectric layer 807 are customizable via photoresist and lithography methods. The transistor 800 may operate at higher frequencies and higher voltages than prior art T-gate transistors.

FIGS. 9A, 9B, 9C, 9D, 9E, 9F, and 9G are illustrations of exemplary process steps for forming the transistor 300 of FIG. 4.

In FIG. 9A, the channel layer 400 may be fabricated or acquired, the epitaxial barrier layer 401 may be grown on the channel layer 400, the epitaxial cap layer 403 may be grown on the epitaxial barrier layer 401, and the dielectric layer 405 may be deposited on the epitaxial cap layer 403. The channel layer 400 may be GaN, GaAs, sapphire, InP, Si, SiC, AlN, or InSb. The epitaxy cap layer 403 may include an AlGaN barrier layer. The dielectric layer 405 may be formed using chemical vapor deposition (CVD), plasma enhanced CVD (PECVD), or atomic layer deposition (ALD). The dielectric layer 405 may be an oxide (e.g., aluminum oxide ($Al_2O_3$) or silicon dioxide ($SiO_2$)) or nitride (e.g., silicon nitride (SiN)).

In FIG. 9B, a first photoresist layer 407 may be deposited and patterned (e.g., portions of the first photoresist layer 407 are selectively removed) on the dielectric layer 405. The first photoresist layer 407 may be PMMA, ZEP, PMGI, or MMA. The first photoresist layer 407 may be patterned by an electron beam (e-beam). The pattern removed from the first photoresist layer 407 may be used to define the gate stem 301 of the transistor 300.

In FIG. 9C, the pattern in the first photoresist layer 407 may be used to etch away the pattern from the dielectric layer 405. Etching may be via dry etching or wet etching. Fluorine (e.g., carbon tetrafluoride ($CF_4$)) or chlorine may be used as a dry etch.

In FIG. 9D, the first photoresist layer 407 may be removed. A solvent bath may be used to remove the first photoresist layer 407. In FIG. 9E a second photoresist layer 409 may be deposited and patterned on the dielectric layer 405. The second photoresist layer 409 may be any of the materials used for the first photoresist layer 407 as described above. Any material and method described above for depositing, etching, and removing the first photoresist layer 407 may be used to deposit, etch, and remove the second photoresist layer 409. The second photoresist layer 409 may be used to define the mini-FP 303 of the transistor 300.

In FIG. 9F, a third photoresist layer 411 may be deposited and patterned on the second photoresist layer 409. The third photoresist layer 411 may be any of the materials used for the first photoresist layer 407 as described above. Any material and method described above for depositing, etching, and removing the first photoresist layer 407 may be used to deposit, etch, and remove the third photoresist layer 411. The third photoresist layer 411 may be used to define the gate top 305 of the transistor 300.

In FIG. 9G, metal may be deposited to form the gate stem 301, the mini-FP 303, and the gate top 305 simultaneously and the third photoresist layer 411 may be removed. The metal may be nickel (Ni), titanium (Ti), platinum (Pt), tungsten (W), tantalum (TaN), titanium nitride (TiN) or gold (Au). The deposition method may include thermal evaporation, chemical vapor deposition, or atomic layer deposition. In an alternate embodiment, the gate stem 301, the mini-FP 303, and the gate top 305 may be formed with the same or different metals in any suitable combination. In an exemplary embodiment, the gate stem 301 may be a metal having a high work function (e.g., Pt) and the mini-FP 303 and the gate top 305 may be a metal having a low resistance (e.g., Au). Any metal deposited on the third photoresist layer 411 may be removed by a solvent in a metal lift-off process. The solvent may be acetone, isopropyl alcohol, or positive resist stripper (PRS).

FIGS. 10A, 10B, 10C, 10D, 10E, 10F, 10G, and 10H are illustrations of exemplary process steps for forming the transistor 500 of FIG. 5.

Figure 10A:
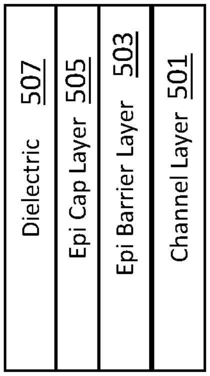
FIGS. 10A, 10B, 10C, 10D, 10E, 10F, 10G, and 10H are illustrations of exemplary process steps for forming the transistor of FIG. 5.

In FIG. 10A, the substrate 501 may be fabricated or acquired including the channel layer, the epitaxial barrier layer 503 may be grown on the channel layer 501, the epitaxial cap layer 505 may be grown on the epitaxial barrier layer 503, and the dielectric layer 507 may be deposited on the epitaxial cap layer 505. In an exemplary embodiment, the substrate comprises GaN, GaAs, sapphire, InP, Si, SiC, AlN, or InSb. The epitaxy cap layer 505 may include an AlGaN barrier layer. The dielectric layer 507 may be formed using CVD, PECVD, or ALD. The dielectric layer 507 may be $Al_2O_3$, SiN, or $SiO_2$.

Figure 10B:
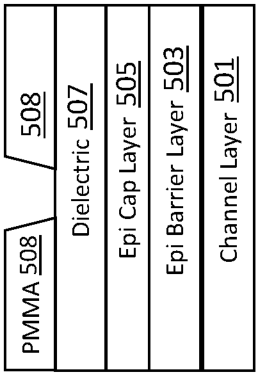

In FIG. 10B, a first photoresist layer 508 may be deposited and patterned (e.g., portions of the first photoresist layer 508 are selectively removed) on the dielectric layer 507. The first photoresist layer 508 may be PMMA, ZEP, PMGI, or MMA. The first photoresist layer 508 may be patterned by an electron beam (e-beam). The pattern removed from the first photoresist layer 508 may be used to define the gate stem 509 of the transistor 500.

Figure 10C:
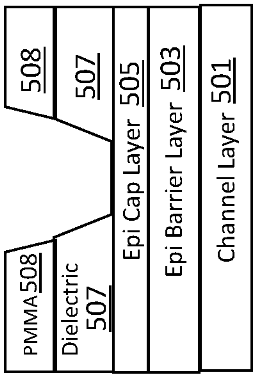
Figure 10D:
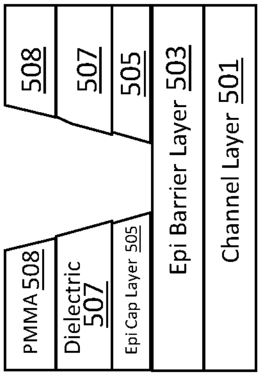

In FIG. 10C, the pattern in the first photoresist layer 508 may be used to etch away the pattern from the dielectric layer 507. In FIG. 10D, the pattern in the first photoresist layer 508 may be used to etch away the pattern from the epitaxial cap layer 505. Etching may be via dry etching or wet etching. Fluorine (e.g., carbon tetrafluoride ($CF_4$)) or chlorine may be used as a dry etch.

Figure 10E:
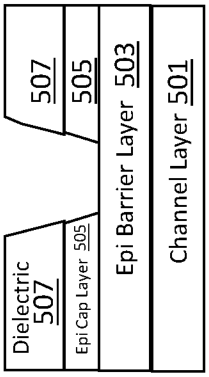
Figure 10F:
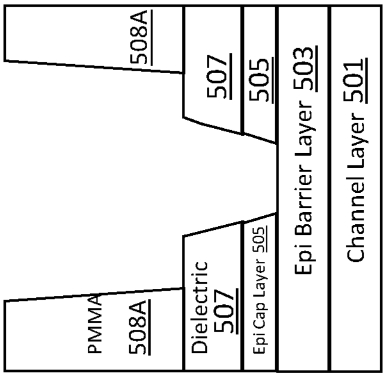

In FIG. 10E, the first photoresist layer 508 is removed. A solvent bath may be used to remove the first photoresist layer 508. In FIG. 10F, a second photoresist layer 508A is deposited and patterned on the dielectric layer 507. The second photoresist layer 508A may be any of the materials used for the first photoresist layer 508 as described above. Any material and method described above for depositing, etching, and removing the first photoresist layer 508 may be used to deposit, etch, and remove the second photoresist layer 508A. The second photoresist layer 508A may be used to define the mini-FP 511 of the transistor 500.

Figure 10G:
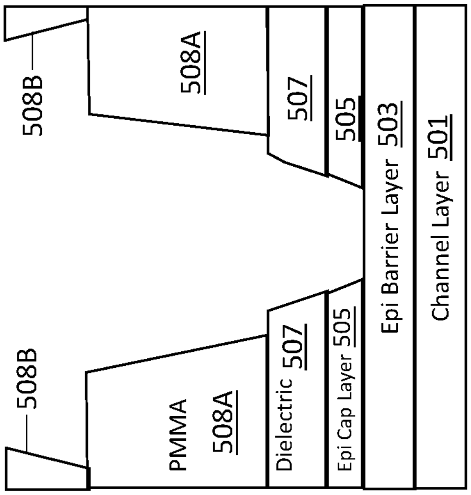

In FIG. 10G, a third photoresist layer 508B is deposited and patterned on the second photoresist layer 508A. The third photoresist layer 508B may be any of the materials used for the first photoresist layer 508 as described above. Any material and method described above for depositing, etching, and removing the first photoresist layer 508 may be used to deposit, etch, and remove the third photoresist layer 508B. The third photoresist layer 508B may be used to define the gate top 513 of the transistor 500.

Figure 10H:
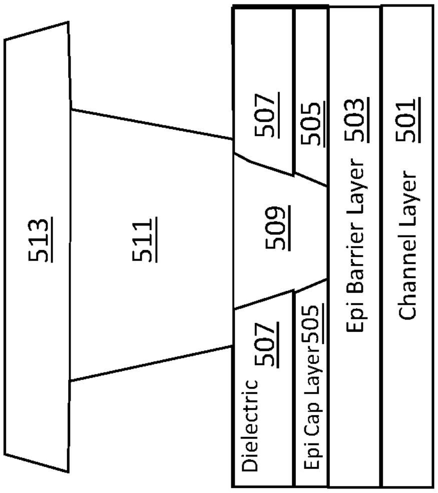

In FIG. 10H, metal is deposited to form the gate stem 509, the mini-FP 511, and the gate top 513 simultaneously and the third photoresist layer 508B is removed. The metal may be Ni, Ti, Pt, W, TaN, TiN or Au. The deposition method may include thermal evaporation, chemical vapor deposition, or atomic layer deposition. In an alternate embodiment, the gate stem 509, the mini-FP 511, and the gate top 513 may be formed with the same or different metals in any suitable combination. In an exemplary embodiment, the gate stem 509 may be a metal having a high work function (e.g., Pt) and the mini-FP 511 and the gate top 513 may be a metal having a low resistance (e.g., Au). Any metal deposited on the third photoresist layer 508B may be removed by a solvent in a metal lift-off process. The solvent may be acetone, isopropyl alcohol, or PRS. The transistors 600, 700, and 800, of FIGS. 6, 7, and 8, respectively, may be processed similarly as in FIGS. 9A, 9B, 9C, 9D, 9E, 9F, 9G, 10A, 10B, 10C, 10D, 10E, 10F, 10G, and 10H with appropriate modification due to the structural differences between the transistors.

Figure 11:
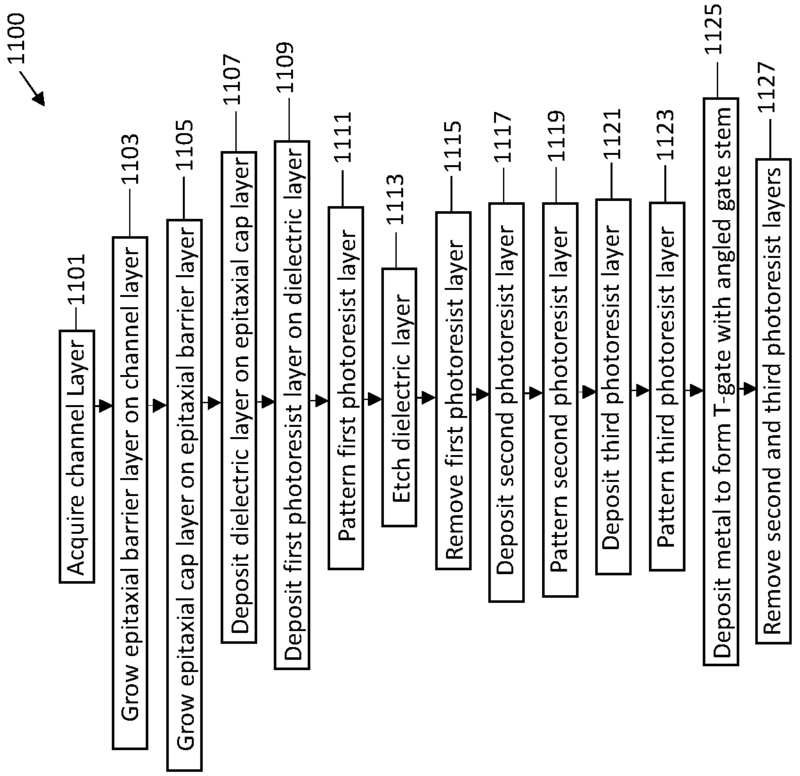
FIG. 11 is an exemplary method of forming a transistor with a T-gate having an angled gate stem and a mini field plate.

FIG. 11 is an exemplary method of forming a transistor with a T-gate having an angled gate stem and a mini field plate. In the exemplary embodiment, the method 1100 comprises acquiring a channel layer in step 1101. The channel layer may be acquired by fabricating or growing the channel layer or purchasing a substrate with a channel layer. In an exemplary embodiment where the channel layer comprises a substrate, the substrate may comprise GaN, GaAs, sapphire, InP, Si, SiC, AlN, or InSb.

Step 1103 comprises growing an epitaxial barrier layer on the channel layer. This step may be optional when an acquired substrate includes the epitaxial barrier layer. Step 1105 comprises growing an epitaxial cap layer on the epitaxial barrier layer. The epitaxy cap layer may include an AlGaN barrier layer.

Step 1107 comprises depositing a dielectric layer on the epitaxial cap layer. The dielectric layer may be formed using CVD, PECVD, or ALD. The dielectric layer may be $Al_2O_3$, SiN, or $SiO_2$.

Step 1109 comprises depositing a first photoresist layer on the dielectric layer. The first photoresist layer may be PMMA, ZEP, PMGI, or MMA.

Step 1111 comprises patterning the first photoresist layer (e.g., portions of the first photoresist layer are selectively removed) on the dielectric layer. The first photoresist layer may be patterned by an e-beam. The pattern removed from the first photoresist layer may be used to define the gate stem 301 of the transistor 300.

Step 1113 comprises etching away the pattern in the first photoresist layer from the dielectric layer. Etching may be via dry etching or wet etching. Fluorine (e.g., carbon tetrafluoride ($CF_4$)) or chlorine may be used as a dry etch.

Step 1115 comprises removing the first photoresist layer. A solvent bath may be used to remove the first photoresist layer.

Step 1117 comprises depositing a second photoresist layer on the dielectric layer. The second photoresist layer may be any of the materials used for the first photoresist layer as described above. Any material and method described above for depositing, etching, and removing the first photoresist layer may be used to deposit, etch, and remove the second photoresist layer.

Step 1119 comprises patterning the second photoresist layer on the dielectric layer. The second photoresist layer may be used to define the mini-FP 303 of the transistor 300.

Step 1121 comprises depositing a third photoresist layer on the second photoresist layer. The third photoresist layer may be any of the materials used for the first photoresist layer as described above. Any material and method described above for depositing, etching, and removing the first photoresist layer may be used to deposit, etch, and remove the third photoresist layer.

Step 1123 comprises patterning the third photoresist layer on the second photoresist layer. The third photoresist layer may be used to define the gate top 305 of the transistor 300.

Step 1125 comprises depositing metal to form a gate stem, a mini-FP, and a gate top (e.g., the gate stem 301, the mini-FP 303, and the gate top 305 of the transistor 300) simultaneously. The metal may be Ni, Ti, Pt, W, TaN, or TiN. The deposition method may include thermal evaporation, chemical vapor deposition, or atomic layer deposition. In an alternate embodiment, the gate stem 301, the mini-FP 303, and the gate top 305 may be formed with the same or different metals in any suitable combination. In an exemplary embodiment, the gate stem 301 may be a metal having a high work function (e.g., Pt) and the mini-FP 303 and the gate top 305 may be a metal having a low resistance (e.g., Au).

Step 1127 comprises removing the second photoresist layer and the third photoresist layer. Any metal deposited on the third photoresist layer may be removed by a solvent in a metal lift-off process. The solvent may be acetone, isopropyl alcohol, or PRS.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

Various embodiments of the concepts, systems, devices, structures, and techniques sought to be protected are described herein with reference to the related drawings. As noted above, in embodiments, the concepts and features described herein may be embodied in a digital multi-beam beamforming system. Alternative embodiments can be devised without departing from the scope of the concepts, systems, devices, structures, and techniques described herein.

It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

For purposes of the description herein, terms such as "upper," "lower," "right," "left," "vertical," "horizontal, "top," "bottom," (to name but a few examples) and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements. Such terms are sometimes referred to as directional or positional terms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A transistor, comprising:

a channel layer;

an epitaxial barrier layer on the channel layer;

an epitaxial cap layer on the epitaxial barrier layer, the epitaxial cap layer having an opening through to the epitaxial barrier layer;

a dielectric layer on the epitaxial cap layer, the dielectric layer having an opening through to the opening in the epitaxial cap layer and to the epitaxial barrier layer;

a gate stem having angled sidewalls, the gate stem disposed in the openings of the epitaxial cap layer and the dielectric layer;

a mini field plate having angled sidewalls, the mini field plate disposed on the gate stem in the openings through the epitaxial cap layer and the dielectric layer and on a portion of the dielectric layer adjacent the opening in the dielectric layer, wherein the angled sidewalls of the gate stem and the mini field plate each comprise exterior angles at a horizontal base in a range from 45 degrees to 89 degrees; and a gate top having a width greater than a width of the mini field plate, the gate top disposed on the mini field plate, wherein the gate stem, the mini field plate, and the gate top form a "T" shape.

2. The transistor of claim 1, wherein the gate stem comprises a length in a range from approximately 20 nanometers (nm) to approximately 500 nm.

3. The transistor of claim 1, wherein the mini field plate comprises a width in a range from approximately 1.5 times to approximately 4 times wider than a length of the gate stem.

4. The transistor of claim 1, wherein the gate top does not directly contact the dielectric layer, the epitaxial cap layer, or the epitaxial barrier layer.

5. The transistor of claim 1, wherein the gate top comprises two wings that branch out on opposite sides of the mini field plate.

6. The transistor of claim 5, wherein tops of the two wings that branch out on the opposite sides of the mini field plate are separated by a gap.

7. The transistor of claim 5, wherein the angled sidewalls of the gate stem pass through the dielectric layer and the epitaxial cap layer.

8. A gate comprising:

a gate stem having angled sidewalls, the gate stem disposed in openings in an epitaxial cap layer and a dielectric layer;

a mini field plate having angled sidewalls, the mini field plate disposed on the gate stem in the openings in the epitaxial cap layer and the dielectric layer and on a portion of the dielectric layer adjacent the opening in the dielectric layer on the gate stem, wherein the angled sidewalls of the gate stem and the mini field plate each comprise exterior angles at a horizontal base in a range from 45 degrees to 89 degrees; and a gate top having a width greater than a width of the mini field plate, the gate top disposed on the mini field plate, wherein the gate stem, the mini field plate, and the gate top form a "T" shape.

9. The gate of claim 8, wherein the gate stem comprises a length in a range from approximately 20 nanometers (nm) to approximately 500 nm.

10. The gate of claim 8, wherein the mini field plate comprises a width in a range from approximately 1.5 times to approximately 4 times wider than a length of the gate stem.

11. The gate of claim 8, wherein the angled sidewalls of the gate stem pass through the dielectric layer and the epitaxial cap layer.

12. The gate of claim 8, wherein the gate top comprises two wings that branch out on opposite sides of the mini field plate.

13. The gate of claim 12, wherein the gate top comprises two wings that branch out on opposite sides of the mini field plate.

14. A method comprising:

depositing a first photoresist layer on a substrate comprising a channel layer, an epitaxial barrier layer disposed over the channel layer, an epitaxial cap layer disposed over the epitaxial barrier layer, and a dielectric layer disposed over the epitaxial cap layer;

patterning the first photoresist layer;

etching the dielectric layer and the epitaxial cap layer based on the patterned first photoresist layer;

depositing a second photoresist layer over the dielectric layer;

patterning the second photoresist layer;

depositing a third photoresist layer over the patterned second photoresist layer;

patterning the third photoresist layer; and depositing metal to form a gate stem, a mini field plate, and a gate top;

wherein the gate stem comprises angled sidewalls in openings of the epitaxial cap layer and the dielectric layer;

wherein the mini field plate comprises angled sidewalls, the mini field plate disposed on the gate stem in the openings through the epitaxial cap layer and the dielectric layer and on a portion of the dielectric layer adjacent the opening in the dielectric layer;

wherein the angled sidewalls of the gate stem and the mini field plate each comprise exterior angles at a horizontal base in a range from 45 degrees to 89 degrees; and wherein the gate top has a width greater than a width of the mini field plate, the gate top disposed on the mini field plate, wherein the gate stem, the mini field plate, and the gate top form a "T" shape.

15. The method of claim 14, wherein the gate stem comprises a length in a range from approximately 20 nanometers (nm) to approximately 500 nm.

16. The method of claim 14, wherein the mini field plate comprises a width in a range from approximately 1.5 times to approximately 4 times wider than a length of the gate stem.

17. The method of claim 14, wherein the gate top does not directly contact the dielectric layer, the epitaxial cap layer, or the epitaxial barrier layer.

18. The method of claim 14, wherein the gate top comprises two wings that branch out on opposite sides of the mini field plate.

19. The method of claim 18, wherein the gate top comprises two wings that branch out on opposite sides of the mini field plate.

20. The method of claim 14, wherein the angled sidewalls of the gate stem pass through the dielectric layer and the epitaxial cap layer.

* * * * *